United States Patent [19]
Byers et al.

[11] Patent Number: 5,664,089
[45] Date of Patent: Sep. 2, 1997

[54] MULTIPLE POWER DOMAIN POWER LOSS DETECTION AND INTERFACE DISABLE

[75] Inventors: Larry L. Byers, Apple Valley; David J. Tanglin, Anoka; Paul A. LaBerge, Coon Rapids; Gregory B. Wiedenman, Woodbury, all of Minn.

[73] Assignee: Unisys Corporation, Blue Bell, Pa.

[21] Appl. No.: 589,793

[22] Filed: Jan. 22, 1996

Related U.S. Application Data

[63] Continuation of Ser. No. 233,862, Apr. 26, 1994, abandoned.

[51] Int. Cl.$^6$ ........................................... G06F 11/00
[52] U.S. Cl. ........................ 395/182.12; 395/182.2
[58] Field of Search .................... 395/182.2, 182.22, 395/182.12, 182.08, 182.03, 750

[56] References Cited

U.S. PATENT DOCUMENTS

| | | | |
|---|---|---|---|
| 4,228,496 | 10/1980 | Katzman et al. | 371/66 |
| 4,495,568 | 1/1985 | Golbert et al. | 364/200 |
| 4,527,157 | 7/1985 | Krikor | 371/66 |
| 4,607,365 | 8/1986 | Greig et al. | 371/66 |
| 4,610,013 | 9/1986 | Long et al. | 371/66 |
| 4,639,864 | 1/1987 | Katzman et al. | 371/66 |
| 4,667,284 | 5/1987 | Asami | 371/9.1 |
| 4,777,626 | 10/1988 | Matsushita et al. | 371/66 |
| 4,783,733 | 11/1988 | Greig et al. | 395/575 |
| 4,800,532 | 1/1989 | Honeck et al. | 365/226 |
| 4,835,671 | 5/1989 | Sato et al. | 371/14 |
| 5,036,455 | 7/1991 | Artwoord | 371/66 |
| 5,212,797 | 5/1993 | Miyake et al. | 395/750 |
| 5,295,258 | 3/1994 | Jewett et al. | 395/575 |
| 5,297,119 | 3/1994 | Tonegawa et al. | 371/66 |

Primary Examiner—Robert W. Beausoliel, Jr.
Assistant Examiner—Joseph E. Palys
Attorney, Agent, or Firm—Charles A. Johnson; Mark T. Starr

[57] ABSTRACT

A power loss detection and recovery circuit for providing continued memory operations upon loss of a supply voltage. Multiple independent power domains, each of which provides an electrically isolated supply voltage, are used to provide power to redundant memory circuitry. A loss of voltage or a degenerative voltage within a power domain is detected, and circuitry residing on a different operational power domain provides recovery operations to allow continued memory activity within that operational power domain. The memories residing in an adjacent pair of power domains redundant, and are therefore written to and read from simultaneously, and circuitry within an operational power domain will prevent further reading of data from the memory residing in a failed power domain, and will also prevent further writing of data to the memory residing in the failed power domain upon recognition of a failed supply voltage within a power domain.

13 Claims, 7 Drawing Sheets

MULTIPLE POWER DOMAIN POWER LOSS DETECTION AND INTERFACE DISABLE

This is a continuation of application Ser. No. 08/233,862 filed on Apr. 26, 1994, now abandoned.

BACKGROUND OF THE INVENTION

1. Field of the Invention

This invention relates to power loss detection in multiple power domains, and more particularly to power loss detection of failing power domains by operational power domains, and to disabling interfaces between the failed power domain and operational power domains which communicate with the failed power domain.

2. Description of the Prior Art

High reliability and minimal system "down" time is vitally important in modern digital systems. One approach to increasing the reliability in a computer system is to utilize redundant "power domains", as described in copending patent application Ser. No. 08/172,661, filed on Dec. 23, 1993, and entitled "Fault Tolerant Clock Distribution System". Such a system utilizes multiple power domains, which are electrically isolated voltage planes, in order to allow circuitry residing in one power domain to remain operational upon the loss of voltage to another power domain. Each power domain can contain substantially equivalent or identical circuitry, including memory modules, so that the loss of one power domain will not result in a system failure or a loss of data. In such a multiple power domain system, communications are carried on between the power domains so that no attempt to access the circuitry and/or the memory modules in a failed power domain occurs. The present invention provides cross-monitoring of the voltage in one power domain by circuitry residing in another power domain, so that an early detection of ensuing voltage loss may be detected, and error-free operation may continue in the remaining power domain(s).

The use of redundant memories storing duplicates of the same data is referred to in U.S. Pat. No. 5,295,258, by Jewett et al., issued Mar. 15, 1994. Such a system utilizes redundant circuitry to prevent inoperability of the system upon a circuit failure. The Jewett et al. reference also utilizes redundant power supplies to increase fault tolerance. However, the Jewett et al. reference does not utilize redundant power domains as in the present invention. The redundancy in supplying voltage is limited to redundancy of power supplies, as depicted in FIG. 13 of Jewett et al. Therefore, the redundant circuitry is powered by both power supplies, rather than having redundant circuitry powered by separate, isolated voltage buses as in the present invention. In the present invention, each power domain is individually monitored by another power domain for power loss of voltage, and if one power domain fails, another will continue to be fully operational. No voting scheme is necessary with the use of redundant power domains, but rather monitoring for a faulty power domain is required, along with disabling further activity associated with the failed power domain.

Another type of recovery circuit for redundant circuitry is shown in U.S. Pat. No. 5,212,797, by Miyake et al., issued May 18, 1993. The redundant Central Processing Units (CPUs) in Miyake et al. each have an associated voltage monitoring circuit to detect when its supply voltage has dropped below a threshold voltage. Upon recognition of such a voltage drop, the corresponding CPU is placed in a standby state, or in other words, stops normal CPU operation. The present invention includes voltage monitoring which monitors for a voltage below a threshold voltage as well. However, the voltage monitoring of the present invention monitors for voltage degradation on a different power domain, so as to disable activity in the failing power domain, and normal operation of the system can continue in the operational power domain. The present invention allows the system to continue to operate without having to stop normal operation with a "standby" state.

The present invention was developed in order to overcome power loss problems associated with the use of redundant circuitry. Logic circuit or memory redundancies are not fully fault tolerant if a power loss occurs or a voltage bus short circuit occurs which can cause all of the circuitry to fail. This single point of failure is overcome through the use of redundant power domains, and utilizing redundant circuitry on the redundant power domains. The loss of one power domain will not result in a loss of circuit operation or in a loss of data, since the remaining operational power domain(s) will continue to supply voltage to the redundant circuits or memories. However, in order to effectively use redundant power domains, an ensuing power loss in a power domain must be recognized, so that no further activity is directed to the failed power domain, and no further communications between operational power domains and the failed power domain take place. The present invention provides such power domain failure recognition and recovery. Each power domain has voltage monitoring circuitry which is monitored by a different power domain's circuitry. This is necessary since the circuitry in a failing power domain cannot be relied upon to accurately monitor itself, since the circuitry will fail as the voltage supplying it degrades. When the circuitry within a power domain acknowledges that the voltage in another power domain has decreased beyond an acceptable threshold, activity begins within the operational power domain to generate a latched signal indicating such a power loss, to generate an interrupt to a processing unit to begin any recovery action, and to disable further reading and writing to memory devices in the failing power domain by logically removing those memory devices from the system configuration. The memory in the operational power domain, which stores duplicate data as that of the memory in the failed power domain, will remain operational, and no data loss occurs. At this point, the memory in the operational power domain no longer has a backup memory, since its backup memory became inoperable at the time of the loss of power in the failed power domain. The processing unit can then direct the data in the operational memory to be redirected to another memory in a power domain which still has an operational backup memory in yet another power domain. The present invention therefore allows a redundant memory system to experience only minimal periods of non-redundant activity, while allowing normal memory operation to continue.

OBJECTS

It is a primary objective of this invention to provide an improved power loss detection system and to allow continued operation upon a loss of a supply voltage.

It is another object of the invention to prevent a power loss from corrupting previously stored data.

It is still another object of the present invention to provide multiple independent power domains for providing redundant isolated supply voltages to redundant memory circuits.

It is yet another object to provide continued memory operation upon the loss of a power domain, by disabling operation in the failed power domain and continuing memory operations in the operational power domains.

It is a further object of the present invention to provide for monitoring and recovery of a power domain's supply voltage by circuitry residing within another power domain, so that circuitry powered by a fully operational supply voltage is performing the monitoring and recovery, rather than circuitry which may fail as its supply voltage fails.

It is another object of the invention to provide circuitry to disable the reading of data from the memory within a failed power domain.

It is still another object of the invention to provide circuitry to disable the writing of data to a memory within a failed power domain.

Other more detailed objectives will become apparent from a consideration of the Drawings and the Detailed Description of the Preferred Embodiment.

SUMMARY OF THE INVENTION

The Multiple Power Domain Power Loss Detection and Interface Disable provides power loss detection in individual power domains, and allows continued operation in remaining operational power domains. The present invention utilizes independent power domains, each providing an electrically isolated supply voltage to circuitry located within that power domain. In its most fundamental state, two power domains are used, where the circuitry in one power domain is redundant of that in the other power domain. Among other circuitry, each power domain provides voltage for a digital memory which resides within its respective power domain. Data to be written by a central processing unit is written to both memories in the two power domains simultaneously, to create duplicate copies of the data in separate power domains. The failure of one power domain will not result in a total data loss, since the remaining operational power domain will provide voltage for its memory. The present invention recognizes when a power domain's voltage is degenerating, and disables further data reads and writes to the memory in the faulty power domain, thus prohibiting the reading and writing of faulty data, and allowing continued operation with the redundant circuitry in the operational power domain.

The present invention utilizes power loss detection circuits in each power domain to monitor the supply voltage, and to provide a low power signal upon recognition of a voltage which is below a predetermined acceptable threshold level. This low power signal is sent to memory control circuits in both power domains, regardless of which power loss detection circuit detected the low supply voltage. The memory control circuits in each power domain then inhibit any further writing of data to the memory in the power domain in which the supply voltage was unacceptably low.

In order to prevent further reading of data from a memory residing in a power domain in which the supply voltage is unacceptably low, a memory selection circuit is provided in each power domain. The memory selection circuit from an operational power domain receives the low power signal from the failing power domain, and removes the memory in the failing power domain from its memory configuration. Therefore, the memory in the failing power domain will no longer be recognized as a memory in which data can be read. Data will then only be read from the memory which resides in the operational power domain, and the system can continue to function normally. Continual operation is based on the use of dual power domains which house redundant circuitry, and the ability of the circuitry to disable circuitry from the failing power domain, and continue to operate using the redundant circuitry from the operational power domain.

Still other objects and advantages of the present invention will become readily apparent to those skilled in this art from the following detailed description, where the preferred embodiment of the invention is shown by way of illustration of the best mode contemplated of carrying out the invention. As will be realized, the invention is capable of other and different embodiments, and its details are capable of modification without departing from the invention. Accordingly, the drawing and description are to be regarded as illustrative in nature, and not as restrictive.

DETAILED DESCRIPTION OF THE PREFERRED EMBODIMENT

Figure 1:
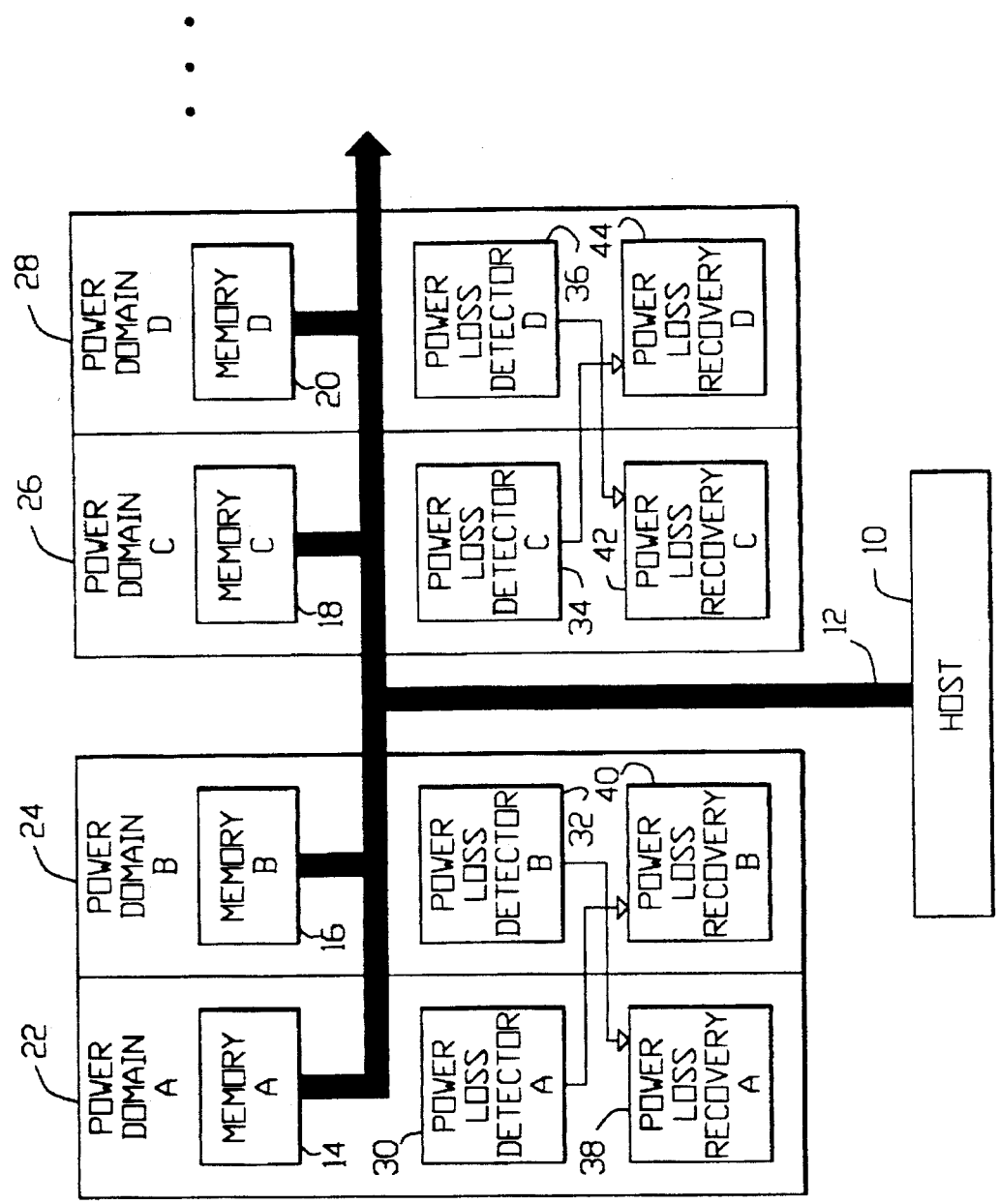
FIG. 1 is a block diagram of a computer system which utilizes redundant memories.

FIG. 1 is a block diagram of a computer system which utilizes redundant memories. The Host 10 represents the Central Processing Unit (CPU) of the computer system. The present invention is utilized in a system as shown in FIG. 1, where multiple memories are used. The Memory Bus 12 represents the data bus to the external memory devices depicted in FIG. 1 as Memory A 14, Memory B 16, Memory C 18 and Memory D 20, and each memory device resides in a separate power domain, labeled Power Domain A 22, Power Domain B 24, Power Domain C 26 and Power Domain D 28 respectively. Memory selection circuitry (not shown) exists in each Power Domain to direct the incoming data to specified memories, and additional memories not shown in FIG. 1 could be included as additional memories. The present invention is equally applicable in systems where the host system provides multiple data buses to access redundant memories, rather than a single data bus in which additional circuitry selects particular memories to access.

The system of FIG. 1 utilizes redundant memories to provide a higher degree of protection from data loss. The system in which the present invention is utilized writes data to multiple memories. For instance, the Host 10 will simultaneously write data to Memory A 14 and Memory B 16, so that a failure of either Memory A or Memory B will not result in an irretrievable loss of data. The failure of the memories themselves is not the sole concern however, since the loss of supply voltage would cause the associated circuitry to cease operating, and RAM-type memories would lose their stored data. It is for this reason that each memory is housed in a separate power domain. The loss of voltage in one power domain will only cause its associated memory to power down, and the redundant memory powered by a separate power domain will continue to operate. In such a system utilizing redundant memories and redundant power domains, it may be necessary to communicate between power domains, and the loss of supply voltage to one power domain would result in a loss of communication between power domains. The present invention provides an early warning that a power domain is losing supply voltage, which triggers activity in the remaining power domain to discontinue communications with the failing power domain. The circuitry which monitors for degradation of the supply voltage consists of the Power Loss Detector A 30, Power Loss Detector B 32, Power Loss Detector C 34, and Power Loss Detector D 36 in Power Domain A 22, Power Domain B 24, Power Domain C 26, and Power Domain D 28 respectively. The operation of the Power Loss Detectors is described in detail in conjunction with FIG. 3. The circuitry which monitors the Power Loss Detectors for power loss consists of Power Loss Recovery A 38, Power Loss Recovery B 40, Power Loss Recovery C 42, and Power Loss Recovery D 44, which reside in Power Domain A 22, Power Domain B 24, Power Domain C 26, and Power Domain D 28 respectively. These circuits monitor for a loss of power from another power domain, since the circuitry within a failing power domain will fail as the voltage fails, and therefore circuitry from a non-failing power domain must monitor for the signal. Power Loss Recovery B 40 monitors the Power Loss Detector A 30, Power Loss Recovery A 38 monitors the Power Loss Detector B 32, Power Loss Recovery D 44 monitors the Power Loss Detector C 34, and Power Loss Recovery C 42 monitors the Power Loss Detector D 36. This cross-monitoring of Power Domain voltage loss allows recovery action to be taken by an operational power domain, and in turn allows the system to continue operating without a system stop. The recovery action that is required is described in further detail in the forthcoming description.

Figure 2:
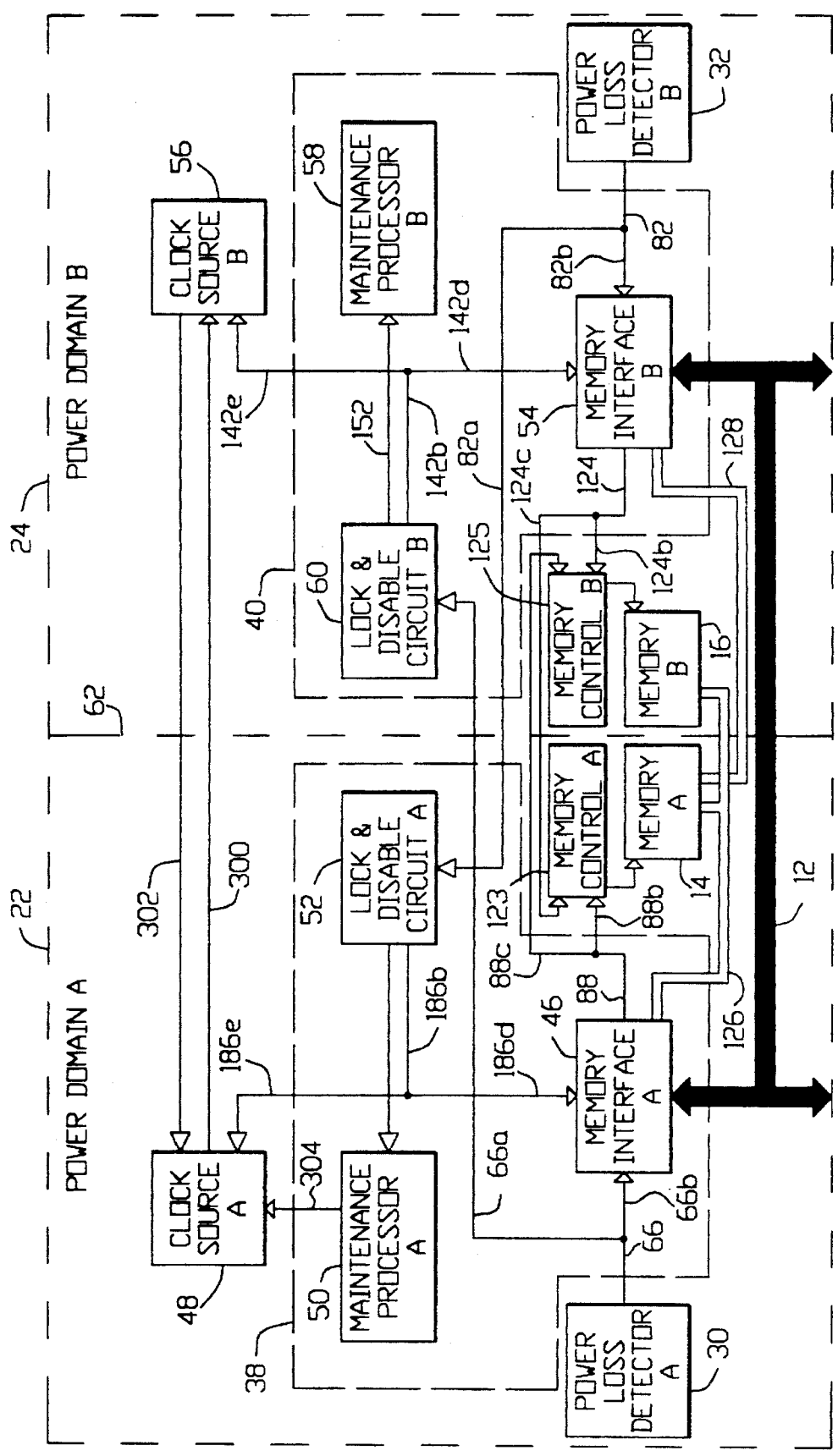
FIG. 2 is a block diagram of the Power Loss Detection and Interface Disable in two separate power domains.

FIG. 2 is a block diagram of the Power Loss Detection and Interface Disable in two separate power domains. FIG. 2 shows two power domains, labeled Power Domain A 22 and Power Domain B 24. Power Domain A 22 provides a supply voltage to Power Loss Detector A 30, Memory Interface A 46, Memory A 14, Clock Source A 48, Maintenance Processor A 50, and Lock & Disable Circuit A 52. The Maintenance Processor A 50, Lock & Disable Circuit A 52, and Memory Interface A 46 comprise the Power Loss Recovery A 38 circuitry of FIG. 1. Similarly, Power Domain B 24 provides a supply voltage to Power Loss Detector B 32, Memory Interface B 54, Memory B 16, Clock Source B 56, Maintenance Processor B 58, and Lock & Disable Circuit B 60. The Maintenance Processor B 58, Lock & Disable Circuit B 60, and Memory Interface B 54 comprise the Power Loss Recovery B 40 circuitry of FIG. 1. Power Domain A 22 is separated from Power Domain B 24 by Power Domain Boundary A/B 62. Each Power Domain is connected to one or more power supplies (not shown) to receive a voltage to supply its respective circuitry.

In the preferred embodiment, Memory A 14 and Memory B 16 are identical memory components which simultaneously receive the same data via the Memory Interface A 46 and/or Memory Interface B 54. The common Memory Bus 12 provides data to Memory A 14 and Memory B 16 through Memory Interface A 46 and Memory Interface B 54. The system is designed so that Memory Interface A 46 can provide data to and receive data from Memory A 14 and/or Memory B 16, and Memory Interface B 54 can provide data to and receive data from Memory A 14 and/or Memory B 16. Bussing could also be accomplished by providing a separate data bus to Memory A 14 and Memory B 16, as long as the same data was transmitted on each bus simultaneously. The bussing structure is not relevant to the present invention, and will not be discussed in further detail.

Since Memory A 14 and Memory B 16 simultaneously receive identical data, they always contain identical sets of data. Therefore, the loss of one memory will not result in a total loss of data, since the corresponding memory in the other power domain will continue to contain valid data. When a power domain's voltage fails, it is important to inform the system of this failure so that no attempt to read data from the faulty power domain's memory occurs. For this reason, the present invention was devised to detect the loss of a power domain's voltage, to disable interfaces between the power domains, and to utilize only the memory within the remaining power domain until the faulty power domain is again operational.

Power Loss Detector A 30 and Power Loss Detector B 32 detect a degradation of the voltage in their respective power domains. This degradation is assumed to be a precursor to a total loss of voltage. The actual quantitative voltage degradation in which an assumption of total voltage loss is made may be chosen by the designer. In the preferred embodiment, a 5% voltage degradation was assumed to indicate an imminent total voltage loss within the power domain, and will trigger the appropriate recovery activity. The circuitry used in the preferred embodiment is powered by +5 volts, and therefore Power Loss Detectors A 30 and B 32 will indicate a 5% reduction in voltage when the voltage in the respective power domain drops to +4.75 volts. This is accomplished by using a comparator circuit to compare the power domain voltage with +4.75 volts.

Figure 3:
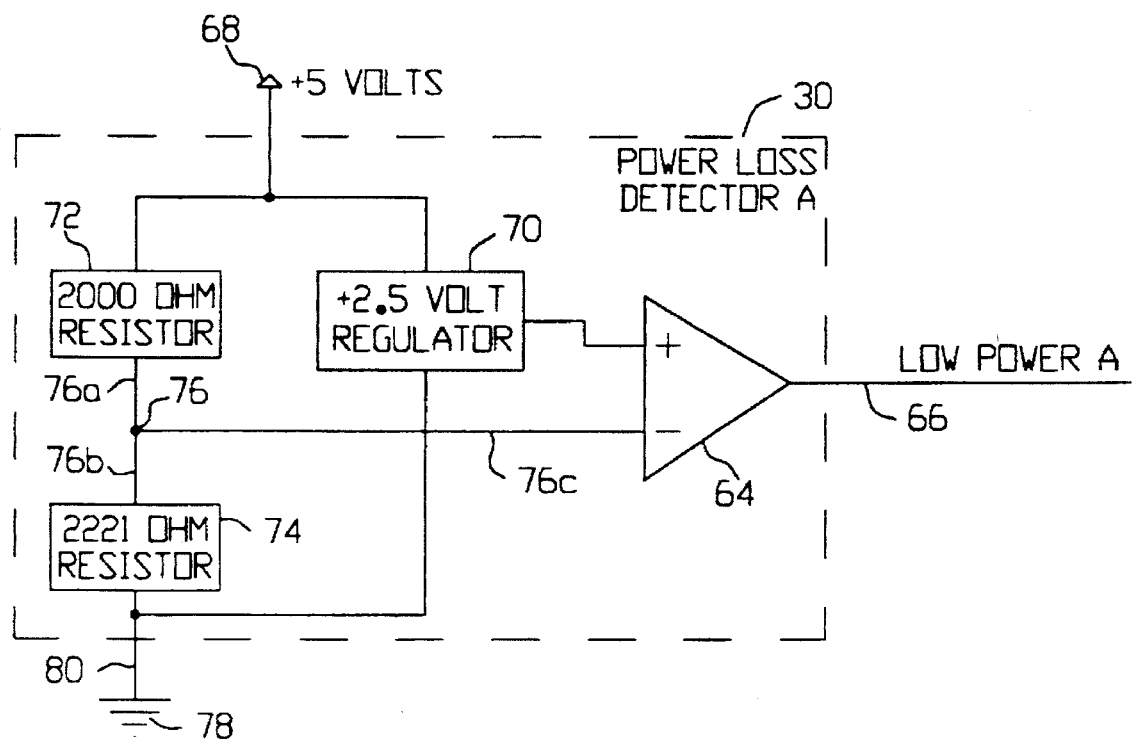
FIG. 3 is a schematic diagram of the Power Loss Detector A comparator circuit.

FIG. 3 is a schematic diagram of the Power Loss Detector A 30 comparator circuit. The Comparator 64 monitors for a 5% degradation of power domain voltage, and issues a LOW POWER A signal on Line 66 upon detection of this degradation. Since the +5 Volt 68 power domain voltage is being monitored, a reference voltage less than +5 volts must be used as a reference voltage in order to ensure proper voltage regulator operation when the +5 Volt 68 supply voltage is degrading. A 2.5 Volt Regulator 70 is used as the reference voltage for the Comparator 64, and therefore less than approximately +2.5 volts at the negative terminal of the Comparator 64 is required to cause the LOW POWER A signal on Line 66 to transition to an active high logic level. A 5% voltage difference from +2.5 volts is 0.125 volts, so the negative terminal of the Comparator 64 must be at least 0.125 volts above the +2.5 volt reference at the positive terminal, or +2.625. A voltage divider is used to generate this voltage, where a 2000 Ohm Resistor 72 is connected to the +5 Volt 68 source to be monitored, and a 2221 Ohm Resistor 74 is connected in series to the 2000 Ohm Resistor 72 via Lines 76a and 76b, and to the system Ground 78 via Line 80. Node 76 is the connection which couples the 2000 Ohm Resistor to the 2221 Ohm Resistor, and the divided voltage at Node 76 is also connected to the negative terminal of the Comparator 64 via Line 76c. This divided voltage is the voltage to be monitored for the 5% voltage degradation, and the resistance values in the preferred embodiment generate +2.63 volts at the negative terminal of the Comparator 64. Therefore, if the +5 Volt 68 source drops 5% to +4.75 volts, the voltage at Node 76 will drop to +2.5 volts, and the Comparator 64 will issue an active high LOW POWER A signal on Line 66.

Returning to FIG. 2, the LOW POWER A signal can be seen on Line 66 as the output of Power Loss Detector A 30. The circuitry of Power Loss Detector B 32 is identical to that of Power Loss Detector A 30, and Power Loss Detector B 32 outputs a LOW POWER B signal on Line 82. The LOW POWER A signal on Line 66a is sent to the Lock & Disable Circuit B 68 in Power Domain B 24, and the LOW POWER B signal on Line 82a is sent to the Lock & Disable Circuit A 52 in Power Domain A 22. The LOW POWER signals must be monitored by circuitry in the other power domain, since the failing power domain will only be operational long enough to send the LOW POWER signal. The operation of the Lock & Disable Circuits will be described later in further detail.

The LOW POWER signals are also sent to Memory Interface circuits in each power domain. The LOW POWER A signal is sent to Memory Interface A 46 on Line 66b, and the LOW POWER B signal is sent to Memory Interface B 54 on Line 82b. The Memory Interface circuits in Power Domain A 22 and Power Domain B 24 contain identical circuitry, so the following description of Memory Interface A 46 is equally applicable to Memory Interface B 54.

Figure 4:
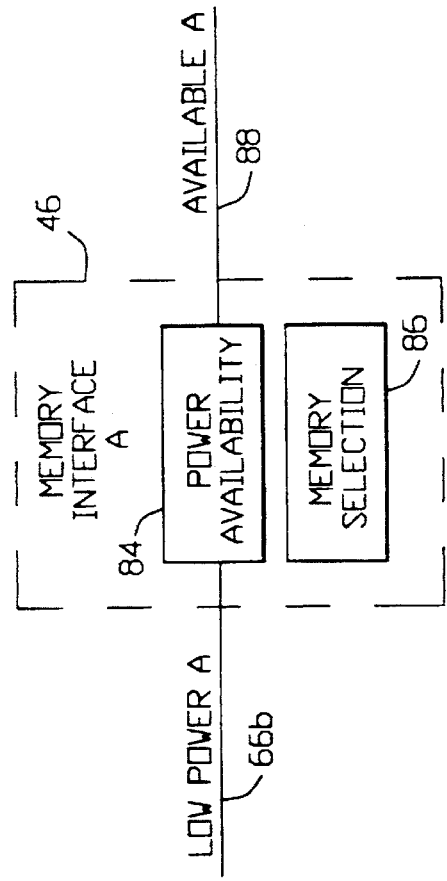
FIG. 4 is a block diagram of the major components of the Memory Interface A circuit.

FIG. 4 is a block diagram of the major components of the Memory Interface A 46 circuit. Each Memory Interface circuit includes Power Availability 84 circuitry and Memory Selection 86 circuitry. The Memory Selection 86 circuitry will be described in conjunction with FIG. 7. The Power Availability 84 circuitry is used to issue an AVAILABLE A signal on Line 88 to Memory A 14, which will indicate that an active LOW POWER A signal on Line 66b has been received and latched.

Figure 5:
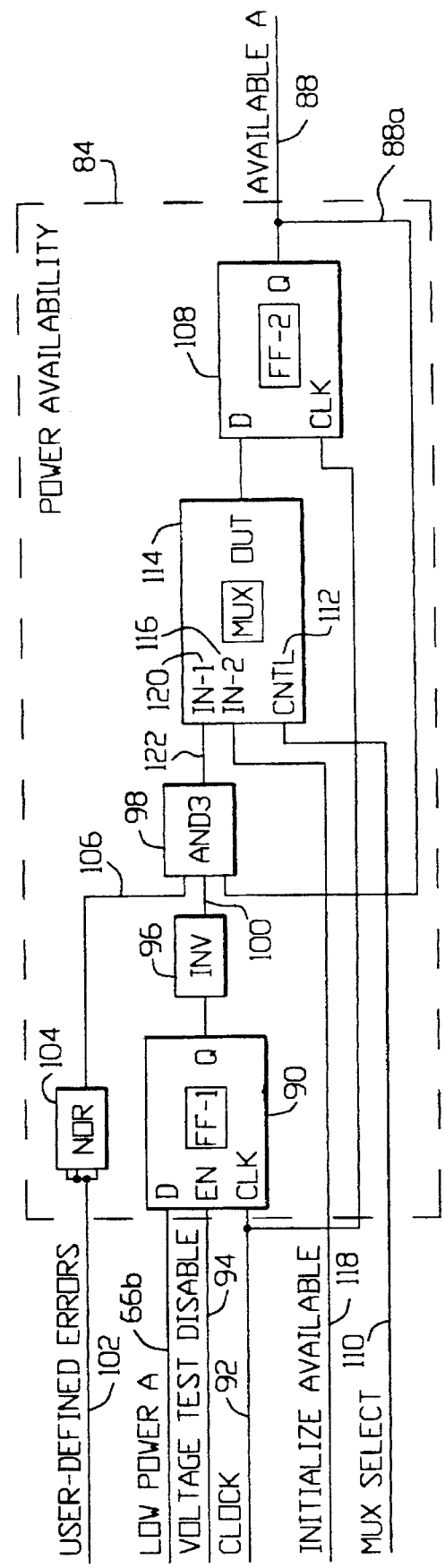
FIG. 5 is a schematic diagram of the Power Availability circuitry.

FIG. 5 is a schematic diagram of the Power Availability 84 circuitry. The LOW POWER A signal on Line 66b is latched by a flip-flop, labeled FF-1 90, which is clocked in at each active triggering edge of the CLOCK signal on Line 92. The VOLTAGE TEST DISABLE signal on Line 94 is an enable input to FF-1 98, and is used to block the LOW POWER A signal on Line 66b during voltage margin testing, where system circuit operation is tested at various power domain voltage levels.

The LOW POWER A signal on Line 66b is an active high logic signal, and is at a low logic level during normal operation, which will cause the output of the inverter, labeled INV 96, to produce a high logic level at an input of the AND-gate labeled AND3 98 during normal operation. If the LOW POWER A signal transitions to a high logic level, the input signal to AND3 98 from INV 96 on Line 100 will drop to a low logic level. The active high signals labeled USER-DEFINED ERRORS on multiple Lines 102 comprise any other types of errors that should generate an active AVAILABLE A signal on Line 88, and the NOR-gate labeled NOR 104 will output a high logic level to AND3 98 on Line 106 when no errors are present, and a low logic level upon receipt of an active high USER-DEFINED ERROR on Lines 102. In the preferred embodiment, the USER-DEFINED ERRORS include parity errors and response failure errors, however the USER-DEFINED ERRORS are not relevant to the present invention, and will not be discussed in further detail. The last input to AND3 98 is connected to the output of the flip-flop labeled FF-2 108 on Line 88a. The signal, AVAILABLE A, at the output of FF-2 108 on Line 88 and Line 88a is set to a logic high during initialization of the system to indicate that its corresponding power domain has an acceptable voltage available. This is accomplished by setting the signal labeled MUX SELECT on Line 110, which is connected to control input CNTL 112 of the multiplexer labeled MUX 114, such that the MUX 114 will output the signal at the MUX 114 input labeled IN-2 116. The INITIALIZE AVAILABLE signal on Line 118, which is the signal input to IN-2 116, is set to a high logic level, so that the output of MUX 114 is initially set to a high logic level. FF-2 108 therefore outputs a high logic level upon initialization of the system. This signal is fed back into AND3 98 so that an active low AVAILABLE A signal on Line 88a will hold the output of AND3 98 at a low logic level. Therefore, during normal operation, the three inputs to AND3 98 are at a high logic level, and the output of AND3 98 is also at a high logic level.

The output of AND3 98 is connected to the input labeled IN-1 120 of MUX 114 on Line 122. Following initialization of the system, the MUX SELECT signal on Line 110 changes logic states to cause MUX 114 to select the input at IN-1 120, which is the output of AND3 98 on Line 122. The signal on Line 122 will remain at a high logic level until a LOW POWER A fault occurs on Line 66b (or a USER-DEFINED ERROR on Lines 102 occurs), which will cause the AND3 98 to output a low logic level on Line 122, and ultimately causes the AVAILABLE A signal on Lines 88 and 88a to be latched at a low logic level, thus indicating that a voltage of at least +4.75 volts is no longer available in Power Domain A 22.

Again referring to FIG. 2, the AVAILABLE A signal on Line 88 is transmitted to the Memory Control A 123 on Line 88b. Similarly, the AVAILABLE B signal on Line 124 is transmitted to the Memory Control B 125 on Line 124b. The AVAILABLE A signal is also transmitted to the Memory Control B 125 via Line 88c, and the AVAILABLE B signal is transmitted to the Memory Control A 123 via Line 124c. The Memory Interface A 46 and B 54 circuits can each receive data from the Memory Bus 12, depending upon which power domain the data enters. When Memory Interface A 46 receives the data, it will write this data to both Memory A 14 and Memory B 16 on Data Bus A 126. When Memory Interface B 54 receives the data, it will write this data to both Memory A 14 and Memory B 16 on Data Bus B 128. In this way, Memory A and Memory B always store the same data, and become backup memories for each other. When a power domain fails, the AVAILABLE A or B signal from the failing power domain is sent to the Memory Control A 123 and the Memory Control B 125 to inhibit Memory A 14 and Memory B 16 respectively from accepting further data from the Memory Interface circuit in the failing power domain. For example, if the Power Loss Detector A 30 in Power Domain A 22 becomes active, an AVAILABLE A signal on Line 88 will be generated, and Memory Control A 123 and Memory Control B 125 will receive the AVAILABLE A signal on Lines 88b and 88c respectively. Memory A and Memory B will then stop accepting data from Memory Interface A 46, and would only accept data from Memory Interface B 54. Similarly, if the Power Loss Detector B 32 in Power Domain B 24 becomes active, an AVAILABLE B signal on Line 124 will be generated, and Memory Control B 125 and Memory Control A 123 will receive the AVAILABLE B signal on Lines 124b and 124c respectively. Memory A and Memory B will then stop accepting data from Memory Interface B 54, and would only accept data from Memory Interface A 46. Memory Control A 123 and Memory Control B 125 therefore inhibit further storing of data from the Memory Interface in the failing power domain.

The LOW POWER A and LOW POWER B signals on Lines 66a and 82a respectively are also sent to circuitry residing in the opposite power domain from that which it is generated. The LOW POWER A signal on Line 66a in Power Domain A 22 is sent to the Lock & Disable Circuit B 60 in Power Domain B 24, and the LOW POWER B signal on Line 82a in Power Domain B 24 is sent to the Lock & Disable Circuit A 52 in Power Domain A 22. The reason for having the opposite power domains monitor the LOW POWER signals is that the LOW POWER signal indicates that a voltage loss in its power domain may be occurring, and if such a voltage loss occurs, the circuitry within that power domain will not continue to function. Therefore, the LOW POWER signal in a failing power domain must be monitored by circuitry in another power domain where there is sufficient voltage for the circuitry to operate correctly. The role of the Lock & Disable Circuits A 52 and B 60 is to sense the LOW POWER signals from the opposite power domain, and latch the signal as soon as possible. The Lock & Disable Circuits also generate signals to be sent to the Memory Interface circuits to disable any communications interfaces between the failing power domain and the operational power domain.

Figure 6:
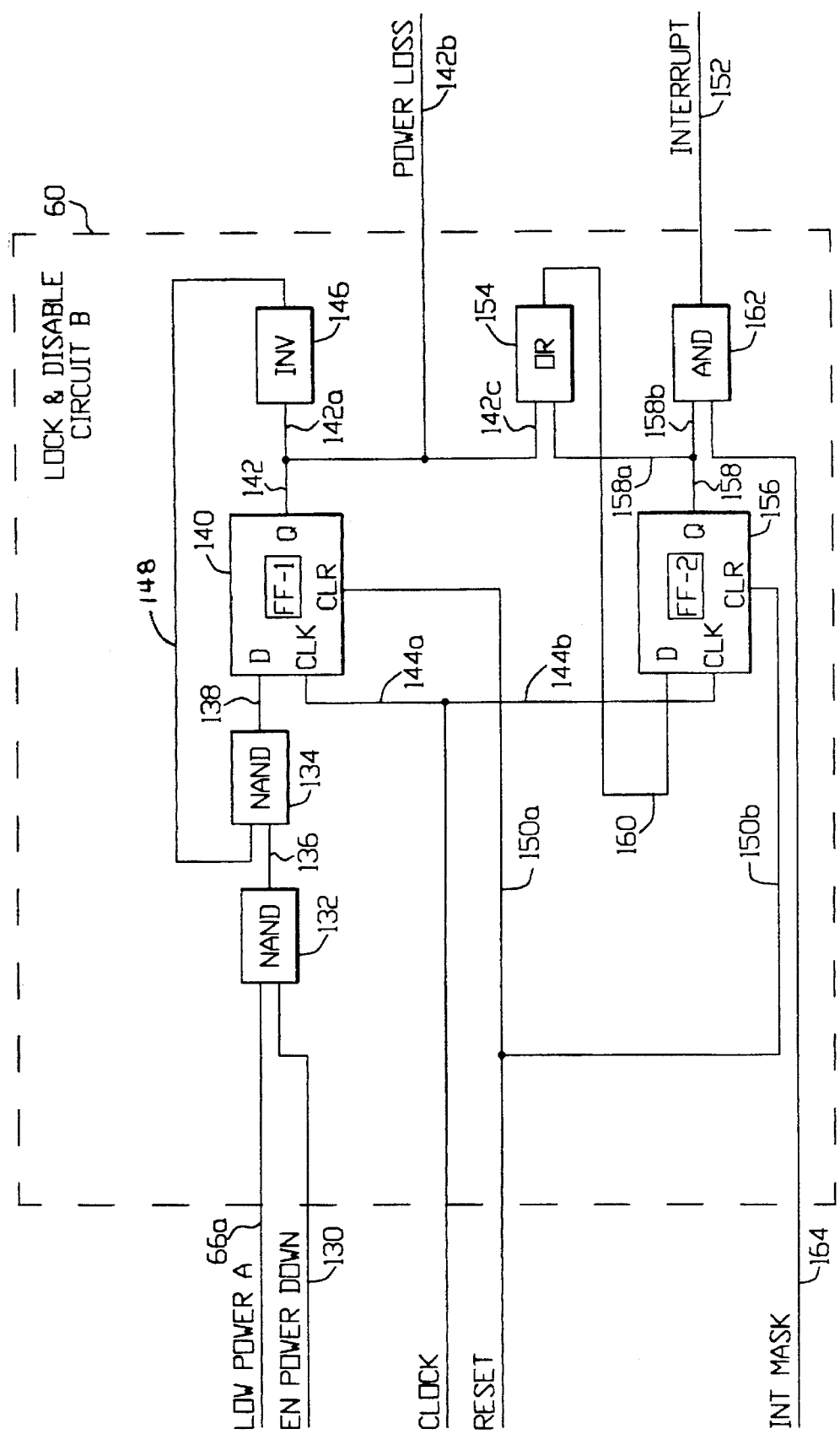
FIG. 6 is a schematic diagram of the Lock & Disable Circuit B in Power Domain B.

FIG. 6 is a schematic diagram of the Lock & Disable Circuit B 60 in Power Domain B 24. The circuitry comprising Lock & Disable Circuit A 52 is identical to that of Lock & Disable Circuit B 60, and therefore the following description equally applies to Lock & Disable Circuit A 52.

Lock & Disable Circuit B 60 first performs the function of latching the LOW POWER A signal on Line 66a, which is generated in Power Domain A 22. The EN POWER DOWN signal on Line 130 is an enable signal used for testing, where an active EN POWER DOWN signal allows the LOW POWER A signal to be recognized, and an inactive EN POWER DOWN signal inhibits the LOW POWER A signal from generating a POWER LOSS signal. This is accomplished by NAND 132, which receives as inputs the LOW POWER A signal and the EN POWER DOWN signal on Lines 66a and 130 respectively. The output of NAND 132 is connected to one input of NAND 134 via Line 136, where the NAND-gates generate a low logic level at their outputs only when both of their inputs are at a high logic level. Assuming that the second input of NAND 134 is normally at a high logic level, NAND 134 will provide a low logic level on Line 138 to the D-input of FF-1 140 when both inputs to NAND 132 are at high logic level, and NAND 134 will provide a low logic level on Line 138 at all other times. Under normal conditions, the EN POWER DOWN signal on Line 130 is enabled and at a high logic level, while the LOW POWER A signal on Line 66a is inactive and at a low logic level. Since both inputs to NAND 134 are then at a high level under normal conditions, FF-140 will output a low logic level on Line 142 on the triggering edge of the CLOCK signal on Line 144a when no LOW POWER A fault is present on Line 66a. The inverter labeled INV 146 receives this low logic level on Line 142a, inverts it, and provides a high logic level on Line 148 to NAND 134. The assumption that this NAND 134 input would be at a high logic level was made because under normal conditions (no active LOW POWER A signal is present on Line 66a), it will be at a high logic level. The POWER LOSS signal on Line 142b will be at a low logic level and will therefore be inactive under normal conditions. The POWER LOSS signal will be initialized to an inactive state at the time the circuit is powered on, because the RESET signal will set the output of FF-1 140 to a low logic level during initialization of the circuit.

When the LOW POWER A signal on Line 66a becomes active due to a power glitch or power loss in Power Domain A 22, NAND 132 outputs a low logic level on Line 136, which causes NAND 134 to output a high logic level on Line 138 to the D-input of FF-1 140. The Q-output of FF-1 140 will output a high logic level on Line 142 at the next triggering edge of the CLOCK signal, which is on Line 144a. Therefore, the POWER LOSS signal on Line 142b will be set to its active-high state to indicate that a LOW POWER A signal has been latched. Latching of the POWER LOSS signal is accomplished by the feedback path shown as Line 148 from INV 146 to an input of NAND 134. When the high logic level is provided on Line 142, INV 146 inverts the high logic level from Line 142a, which provides the NAND 134 input from Line 148 with a low logic level. This will "lock" the output of FF-1 140 to a high logic level, which accordingly locks the POWER LOSS signal on Line 142b to a high, active logic level. The POWER LOSS signal will remain active until a RESET signal on Line 150a is issued. In sum, an active LOW POWER A signal on Line 66a will be latched on the next active triggering edge of the CLOCK signal to generate a latched POWER LOSS signal on Line 142b.

Lock & Disable Circuit B 60 also provides an interrupt for Maintenance Processor B 58 (shown in FIG. 2) on Line 152 so that the Maintenance Processor B 58 can take appropriate actions upon the occurrence of a LOW POWER A signal. The Q-output of FF-1 140 on Line 142 which drives the POWER LOSS signal on Line 142b also drives the signal on Line 142c to the OR-gate labeled OR 154. The remaining input to OR 154 receives the output signal of FF-2 156 via Line 158a, which is initialized to a low logic level through a RESET signal on Line 150b. The OR 154 output will provide a low logic level to the D input of FF-2 156 on Line 160 while both OR 154 inputs are at a low logic level. This in turn provides a low logic level on Line 158b to AND 162, which holds the INTERRUPT signal on Line 152 at an inactive low logic level. The INT MASK signal on Line 164 is an interrupt mask which provides the option to disable the interrupt.

When the POWER LOSS signal on Line 142b becomes active, the high logic level on Line 142c causes OR 154 to output a high logic level on Line 160. FF-2 156 will output a high logic level on Line 158 on the next triggering edge of the CLOCK signal on Line 144b. Assuming the INT MASK signal on Line 164 is activated to a high logic level, an INTERRUPT signal will occur on Line 152, which will interrupt the Maintenance Processor B 58 in FIG. 2.

Referring to FIG. 2, Maintenance Processor B 58 and Maintenance Processor A 50 in the preferred embodiment are microprocessors that can be interrupted to perform maintenance and recovery operations. The recovery actions of the preferred embodiment include attempts to transfer data from the memory in a failing power domain to the memory in an operational power domain. The memories in adjacent power domains, such as Power Domain A 22 and Power Domain B 24, each simultaneously receive identical data, and therefore the loss of one of the memories would result in a situation where the remaining memory in the adjacent power domain would have no operational backup memory, and any failure of the remaining memory would result in data loss. Therefore, the Maintenance Processors also attempt to transfer the data stored in the remaining memory to a memory residing in another pair of power domains (if other power domains are present in the configuration). Finally, the Maintenance Processors also disable any interfaces it may have with the faulty power domain.

Figure 7:
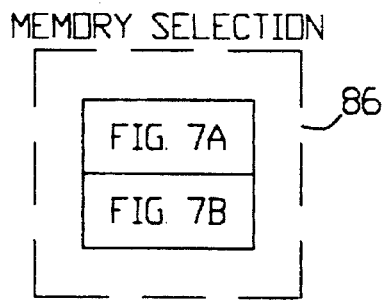
FIG. 7 includes FIG. 7A and FIG. 7B positioned as shown, and illustrates a complete composite logic diagram of the Memory Selection circuitry in Memory Interface B.
Figure 7A:
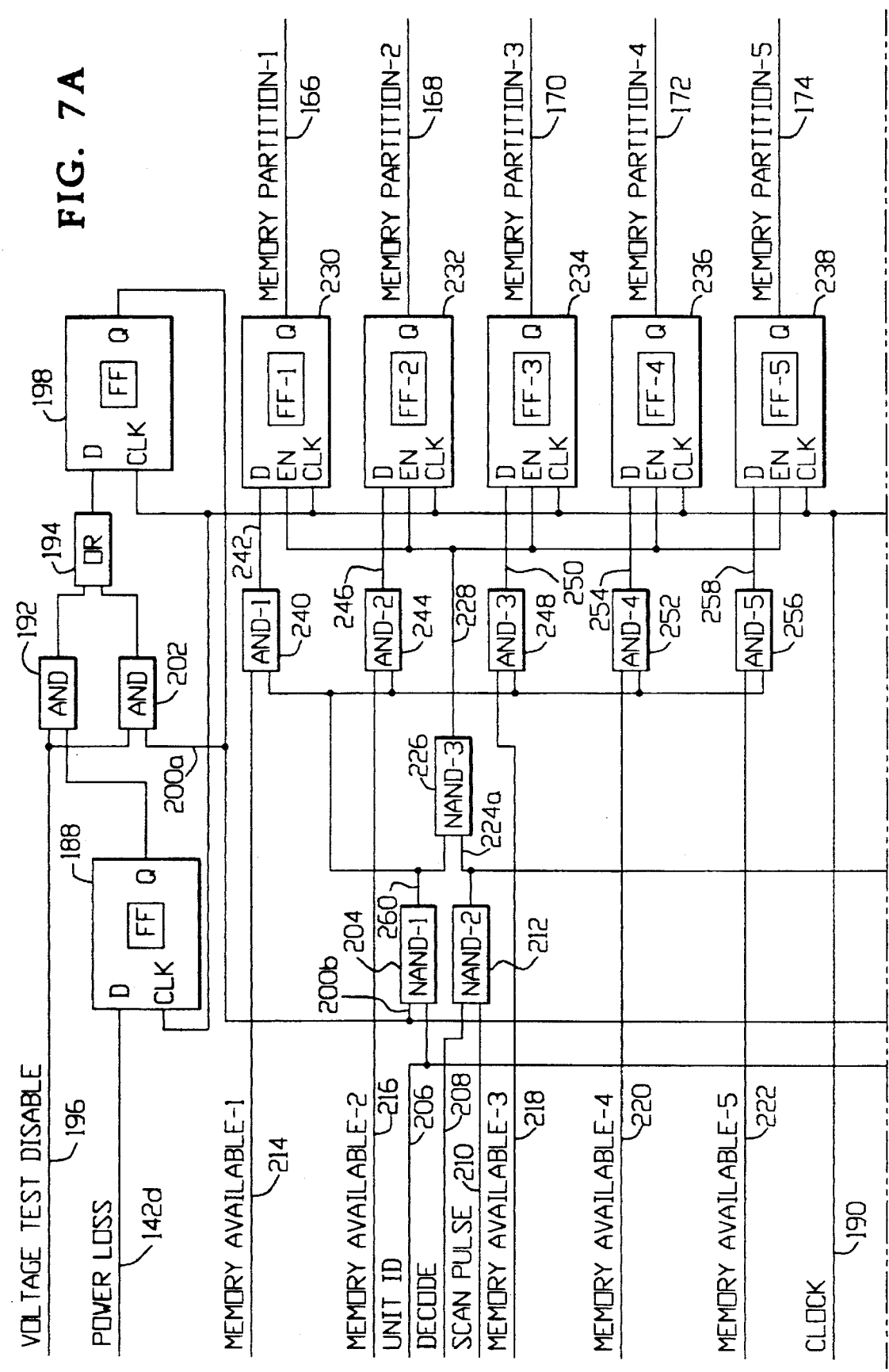
Figure 7B:
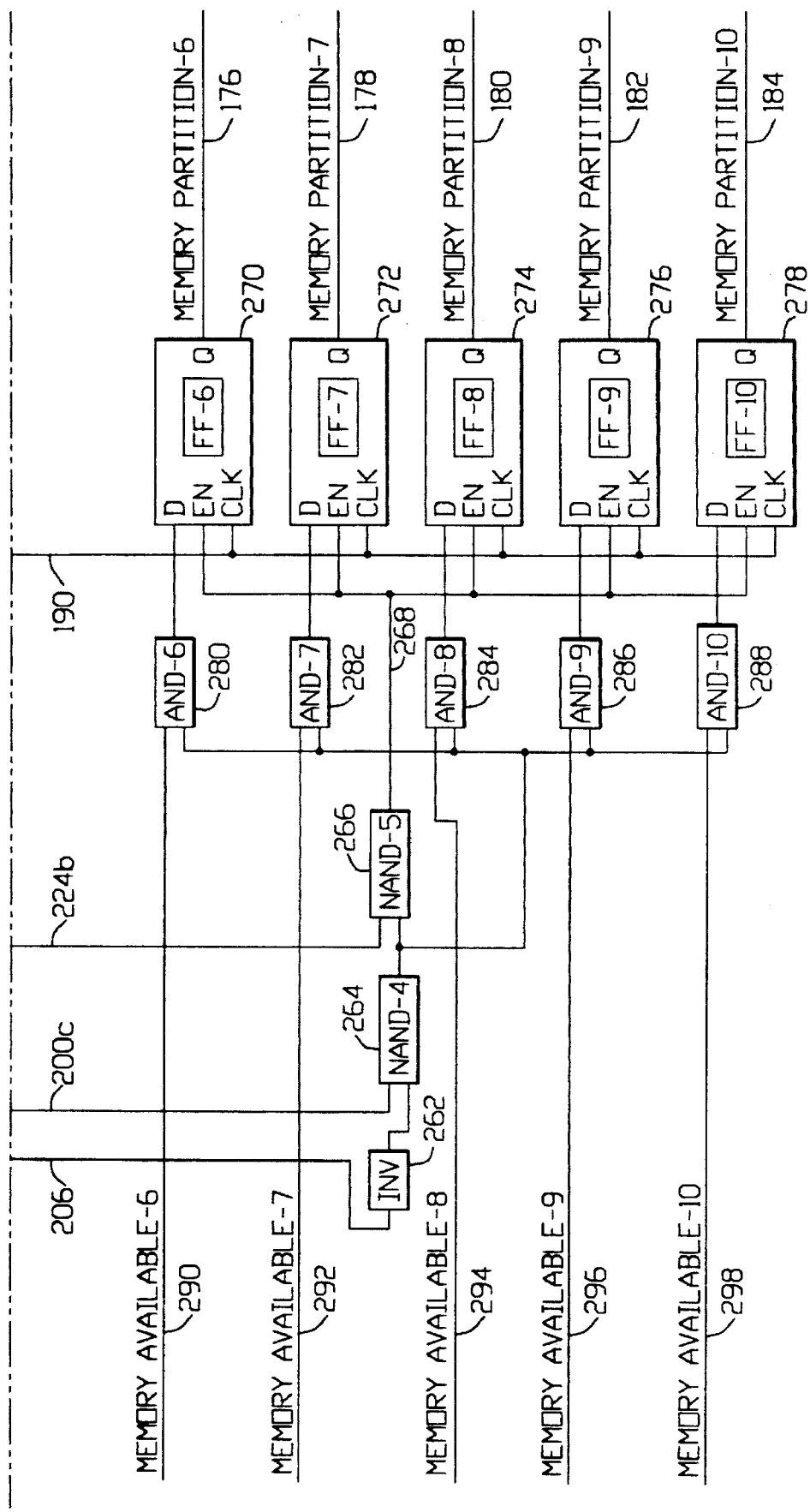

FIG. 7 includes FIG. 7A and FIG. 7B positioned as shown, and illustrates a complete composite logic diagram of the Memory Selection 86 circuitry in Memory Interface B 54. The circuitry of the Memory Selection 86 in Memory Interface A 46 is identical to that of Memory Interface B 54, and therefore the forthcoming description is equally applicable to the Memory Selection 86 circuitry of Memory Interface A 46.

The Memory Selection 86 circuitry is designed to indicate that a power loss in a power domain has occurred, and that no further attempts to read data from or write data to a memory in a failed power domain take place. At initialization of the system, a signal is stored for each memory card within Memory A 14 or Memory B 16 indicating that the memory will or will not be recognized as part of the system configuration. These signals allow the memory to be "partitioned" into the configuration desired. These signals are the MEMORY PARTITION-1 signal on Line 166, MEMORY PARTITION-2 on Line 168, MEMORY PARTITION-3 on Line 170, MEMORY PARTITION-4 on Line 172, MEMORY PARTITION-5 on Line 174, MEMORY PARTITION-6 on Line 176, MEMORY PARTITION-7 on Line 178, MEMORY PARTITION-8 on Line 180, MEMORY PARTITION-9 on Line 182, and MEMORY PARTITION-10 on Line 184 (generically referred to as "Memory Partition" signals). In the preferred embodiment, up to five memory cards reside within Memory A 14, and also within Memory B 16, and a Memory Partition signal for is required for each one, which is why ten Memory Partition signals are required in the preferred embodiment. The number of Memory Partition signals can easily be increased or decreased depending upon the number of memory cards used in the system.

The object of the Memory Selection 86 circuitry is to inactivate the Memory Partition signals for the Memory in the failing/failed power domain. An active Memory Partition signal indicates that its associated memory card in Memory A 14 or Memory B 16 will be recognized as available for reading and writing. Upon loss of power in a power domain, the Lock & Disable Circuit A 52 or B 60 in the remaining operational power domain will generate a POWER LOSS signal on Line 186b or Line 142b respectively, to be sent to Memory Interface A 46 or Memory Interface B 54 on Line 186d or Line 142d respectively. The POWER LOSS signal triggers the Memory Selection 86 circuitry to disable the Memory Partition signals for the memory cards in the failing/failed power domain so that no further attempts to read or write those memory cards occur.

The POWER LOSS signal on Line 142d in FIG. 7 is clocked to the Q-output of FF 188 at the next triggering edge of the CLOCK signal on Line 190. This output is provided to AND 192, and is passed through to OR 194 if the VOLTAGE TEST DISABLE signal on Line 196 indicates that no voltage testing of the system is being performed. Developmental testing of the circuitry is performed at various supply voltage levels to indicate the range of voltages that the system can effectively operate under, and the low logic level VOLTAGE TEST DISABLE signal provides a method of disabling the inactivation of Memory Partition signals during testing phases. OR 194 passes the signal to FF 198 to "lock" the active POWER LOSS signal on Line 142d. This is accomplished by the feedback path on Line 200a to AND 202, where AND 202 passes a high logic level to OR 194 which holds the D-input of FF 198 at a high logic level, thus locking the output of FF 198 at a high logic level, hereafter referred to as the LOCKED POWER LOSS signal.

The LOCKED POWER LOSS signal on Line 200b is then used as an input to NAND-1 204. The second input to NAND-1 204 is provided by the UNIT ID signal on Line 206, which is a signal indicating whether the Memory Selection 86 circuitry is residing in Power Domain A 22 or Power Domain B 24. Since the same circuitry resides in the Memory Selection 86 circuitry in Memory Interface A 46 and Memory Interface B 54, the UNIT ID signal is necessary to identify which power domain the circuit is residing in. If the circuit is residing in Power Domain B 24 the UNIT ID signal will be at an active high level to enable NAND-1 204 to inactivate the Memory Partition signals associated with Power Domain A 22 upon recognition of a LOCKED POWER LOSS signal. The Memory Partition signals associated with Power Domain A 22 consist of the MEMORY PARTITION-1 signal on Line 166, MEMORY PARTITION-2 on Line 168, MEMORY PARTITION-3 on Line 170, MEMORY PARTITION-4 on Line 172, and MEMORY PARTITION-5 on Line 174. The Memory Partition signals associated with Power Domain B 24 consist of the MEMORY PARTITION-6 signal on Line 176, MEMORY PARTITION-7 on Line 178, MEMORY PARTITION-8 on Line 180, MEMORY PARTITION-9 on Line 182, and MEMORY PARTITION-10 on Line 184, which may be inactivated upon recognition of a LOCKED POWER LOSS signal when the UNIT ID signal is at a low logic level, indicating that the circuitry is residing within Power Domain A 22. For purposes of this description, Memory Interface B 54 will be described which resides in Power Domain B 24, and therefore the UNIT ID signal will be at a high logic level, enabling the NAND-1 204 gate to generate a low output upon the occurrence of an active high LOCKED POWER LOSS signal on Line 200b.

The DECODE signal on Line 208 and the SCAN PULSE signal on Line 210 which are inputs to NAND-2 212 are enable signals used in the preferred embodiment which must be active before the Memory Partition signals can be set to an initialized state upon initialization of the system. Therefore, at the time of initialization, the DECODE signal and the SCAN PULSE signal will be activated so that the appropriate logic levels may be recognized on the MEMORY AVAILABLE-1 signal on Line 214, the MEMORY AVAILABLE-2 signal on Line 216, the MEMORY AVAILABLE-3 signal on Line 218, the MEMORY AVAILABLE-4 signal on Line 220, and the MEMORY AVAILABLE-5 signal on Line 222 (generically referred to as the "Memory Available" signals). Therefore, the Memory Available signals are used to set the Memory Partition signals upon initialization of the system when the DECODE and the SCAN PULSE signals are active, in order to initially set the memory "partitioning" (i.e., to indicate which memory cards will be available in the system).

The DECODE signal on Line 208 and the SCAN PULSE signal on Line 210, when active, generate a low logic level on Line 224a, which causes the output of NAND-3 226 to go to a high logic level, since a low logic level on either input of a NAND-gate produce a high logic level at the output. This high logic level on Line 228 enables the flip-flops labeled FF-1 230, FF-2 232, FF-3 234, FF-4 236, and FF-5 238. The data inputs of each of these flip-flops are driven by AND-gates. AND-1 240 is coupled to the D-input of FF-1 230 via Line 242, AND-2 244 is coupled to the D-input of FF-2 232 via Line 246, AND-3 248 is coupled to the D-input of FF-3 234 via Line 250, AND-4 252 is coupled to the D-input of FF-4 236 via Line 254, and AND-5 256 is coupled to the D-input of FF-5 238 via Line 258. Since each flip-flop is enabled at initialization when the DECODE signal and the SCAN PULSE signal is active, an active Memory Available signal will cause the associated flip-flop to set its Memory Partition signal to an active high state. The remaining input to the AND-gates will be at a high logic level, thus allowing the Memory Available signals to pass to their outputs, as long as no LOCKED POWER LOSS signal is present which would cause the NAND-1 204 output to be at a low logic level. In sum, during initialization of the system memory configuration, the Memory Partition signals will be set to the level indicated by the associated Memory Available signals as long as no LOCKED POWER LOSS signal on Line 200b is present, and as long as the DECODE signal on Line 208 and the SCAN PULSE signal on Line 210 are activated.

Following initialization of the Memory Partition signals, the occurrence of a LOCKED POWER LOSS signal on Line 200b will disable all Memory Partition signals associated with the failing/failed power domain. An active LOCKED POWER LOSS signal will cause the output of NAND-1 204 on Line 260 to drop to a low logic level, which will in turn cause the output of NAND-3 226 on Line 228 to go to a high logic level, thus enabling the flip-flops labeled FF-1 230, FF-2 232, FF-3 234, FF-4 236, and FF-5 238. Furthermore, the low logic level at the output of NAND-1 204 on Line 260, which is connected to AND-1 240, AND-2 244, AND-3 248, AND-4 252, and AND-5 256, will cause the outputs of these AND-gates to drop to a low logic level. Therefore, on the next triggering edge of the CLOCK signal on Line 190, all flip-flops will generate low logic level outputs, and will therefore disable the MEMORY PARTITION-1 signal on Line 166, the MEMORY PARTITION-2 signal on Line 168, the MEMORY PARTITION-3 signal on Line 170, the MEMORY PARTITION-4 signal on Line 172, and the MEMORY PARTITION-5 signal on Line 174.

The POWER LOSS signal on Line 142d for purposes of a Power Domain A 22 voltage loss is generated by the Lock & Disable Circuit B 60 in Power Domain B 24, which generates the POWER LOSS signal from the LOW POWER A signal on Line 66a from Power Domain A 22 when the voltage in Power Domain A 22 goes below the threshold voltage. When the Memory Partition signals on Lines 166, 168, 170, 172, and 174 are cleared as a result of an active POWER LOSS signal on Line 142d, Memory Interface B 54 will stop acknowledging the data from Memory A 14. Under normal conditions, each Memory Interface accepts data from both Memory A 14 and Memory B 16, and compares the data to monitor for data discrepancies which would indicate faulty data. After a successful comparison, the data from either Memory A or Memory B could be used as the data to be returned to the Host 10, and in the preferred embodiment, the data from Memory A 14 is the data chosen. When the Memory Partition signals on Lines 166, 168, 170, 172, and 174 are cleared (i.e., an active POWER LOSS signal was received), the Memory Interface B 54 will no longer accept the data from Memory A 14 as valid data, and therefore no data comparison will take place, and the data from Memory B 16 will be returned to the Host 10. Each Memory Partition signal associated with each memory card in the preferred embodiment is checked in the Memory Interface B 54 before acceptance of data is allowed from Memory A 14. This check is performed simply by monitoring the Memory Partition signals before allowing receipt of the data, and such checking and disabling methods are known by those skilled in the art.

Where the Memory Selection 86 circuitry resides in Power Domain A 22, the UNIT ID signal on Line 206 will be at a low logic level, which allows a different set of Memory Partition signals to be manipulated. As described earlier, the Memory Partition signals associated with Power Domain B 24 consist of the MEMORY PARTITION-6 signal on Line 176, MEMORY PARTITION-7 on Line 178, MEMORY PARTITION-8 on Line 180, MEMORY PARTITION-9 on Line 182, and MEMORY PARTITION-10 on Line 184. The operation of the circuitry for the Memory Partition signals associated with Power Domain B 24 works identically to that of the circuitry for the Memory Partition signals associated with Power Domain A 22.

The low logic level UNIT ID signal on Line 206 becomes an input to the inverter labeled INV 262, which outputs a high logic level to NAND-4 264 to enable NAND-4 264 to pass the LOCKED POWER LOSS signal on Line 200c to pass to its output. Initialization of the Memory Partition signals associated with Power Domain B 24 is the same as that as was described for initialization of the Memory Partition signals associated with Power Domain A 22. Therefore, during initialization, the DECODE and SCAN PULSE signals on Lines 208 and 210 respectively will be at a high logic level, which generate a low logic level on Line 224b connected to NAND-5 266. This low level input to NAND-5 266 will generate a high logic level on Line 268, which will enable FF-6 270, FF-7 272, FF-8 274, FF-9 276, and FF-10 278. During initialization where no LOCKED POWER LOSS signal is present on Line 200c, the output of NAND-4 264 will be at a high logic level to enable AND-6 280, AND-7 282, AND-8 284, AND-9 286, and AND-10 288 to pass the MEMORY AVAILABLE-6 signal on Line 290, the MEMORY AVAILABLE-7 signal on Line 292, the MEMORY AVAILABLE-8 signal on Line 294, the MEMORY AVAILABLE-9 signal on Line 296, and the MEMORY AVAILABLE-10 signal on Line 298 respectively. Therefore, these Memory Partition signals are preset to indicate which memory cards in Power Domain B 24 are to be available for use.

The occurrence of an active LOCKED POWER LOSS signal on Line 200c causes the output of NAND-4 264 to output a low logic level. This will cause the outputs of AND-6 280, AND-7 282, AND-8 284, AND-9 286, and AND-10 288 to go to a low logic level. On the next triggering edge of the CLOCK signal on Line 190, FF-6 270, FF-7 272, FF-8 274, FF-9 276, and FF-10 278 will output low logic levels for the MEMORY PARTITION-6 signal, the MEMORY PARTITION-7 signal, the MEMORY PARTITION-8 signal, the MEMORY PARTITION-9 signal, and the MEMORY PARTITION-10 signal on Lines 176, 178, 180, 182, and 184 respectively.

The POWER LOSS signal on Line 200d for purposes of a Power Domain B 24 voltage loss is generated by the Lock & Disable Circuit A 52 in Power Domain A 22, which generates the POWER LOSS signal from the LOW POWER B signal on, Line 82a from Power Domain B 24 when the voltage in Power Domain B 24 goes below the threshold voltage. When the Memory Partition signals on Lines 176, 178, 180, 182, and 184 are cleared (i.e., an active POWER LOSS signal was received), the Memory Interface A 46 will no longer accept the data from Memory B 16 as valid data, and therefore no data comparison will take place, and the data from Memory A 14 will be returned to the Host 10. Each Memory Partition signal associated with each memory card in the preferred embodiment is checked in the Memory Interface A 46 before acceptance of data is allowed from Memory B 16.

Again referring to FIG. 2, the POWER LOSS signals on Lines 186e and 142e are sent to the Clock Source A 48 and Clock Source B 56 circuits respectively. The Clock Source A and B circuits generate the system clocking which clocks the circuitry, including the Memory, within its power domain (Clock Source interconnections not shown). Clock Source A 48 and Clock Source B 56 are coupled by the MAINTENANCE CROSSOVER signals on Lines 300 and 302, and are used to perform maintenance operations upon loss of a Clock Source signal. For instance, if Clock Source B 56 were to fail, the Maintenance Processor A 50 would instruct Clock Source A 48 on Line 304 to provide clock signals for Power Domain B 24 circuitry, and Clock Source A 48 would ignore redundant clock signals from Clock Source B 56. The operation and interconnection of the Clock Source A 48 and Clock Source B 56 circuits is not relevant to the present invention, except for the fact that the POWER LOSS signals are used to disable further communications between the two Clock Source circuits.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the appended claims.

What is claimed is:

1. A power loss detection and recovery circuit for detecting voltage degradation or voltage loss of one or more voltage sources supplying specified circuitry, and for disabling circuit activity within an associated portion of the specified circuitry when the voltage source supplying that associated portion degrades or fails, the power loss detection and recovery circuit comprising:

a plurality of independent power domains, each supplying the associated portion of the specified circuitry, each of the associated portions of the specified circuitry adapted to store data signals, each said independent power domain for providing an electrically isolated voltage to the associated portion of the specified circuitry;

data processing means for reading and writing stored data signals;

a plurality of power loss detection means, a different one of said plurality of power loss detection means in an associated one of said plurality of power domains, each for detecting whether said voltage from its respective one of said plurality of power domains has dropped below an acceptable threshold level and for providing low power signals in response to said voltage dropping below said acceptable threshold level;

a plurality of power loss recovery means, a different one of said plurality of power loss recovery means in an associated one of said plurality of power domains, each coupled to a respectively associated one of said plurality of power loss detection means from a different one of said plurality of power domains, for disabling further reading and writing of said stored data signals by said data processing means to and from the associated portion of the specified circuitry residing in said different one of said plurality of power domains in response to said one of said low power signals from said different one of said plurality of power domains.

2. A power loss detection and recovery circuit as in claim 1, wherein said plurality of power domains are associated in pairs, so that in any given pair of said plurality of power domains, the one of said plurality of power loss recovery means in each one of said plurality of power domains comprising a pair monitors the one of said plurality of power loss detection means in the other one of said plurality of power domains comprising a pair.

3. For use in a system as in claim 1 wherein the specified circuitry contains one or more memory devices, a power loss detection and recovery circuit as in claim 1, wherein each of said plurality of power loss recovery means includes memory selection means for including the memory devices which reside within said different one of said plurality of power domains as part of a total system memory configuration when no said one of said low power signals from said different one of said plurality of power domains is received, and for excluding the memory devices as said part of said total system memory configuration upon receiving said one of said low power signals from said different one of said plurality of power domains.

4. A power loss detection and recovery circuit as in claim 3, wherein said memory selection means includes a plurality of latching means, one of said plurality of latching means corresponding to each one of said memory devices residing within said different one of said plurality of power domains, each for latching a signal indicative of whether its corresponding one of said memory devices is to be included or excluded within said part of said total system memory configuration.

5. A power loss detection and recovery circuit as in claim 1, wherein said stored data signals are redundantly stored in each of said associated portions of the specified circuitry.

6. A power loss detection and recovery circuit as in claim 5 wherein each of said plurality of power loss recovery means in said associated one of said plurality of power domains is capable of electronically disabling further reading and writing of said stored data signals residing in said different one of said plurality of power domains by the associated portion of the specified circuitry residing in said associated one of said power domains, and wherein each of said power loss recovery means in said associated one of said power domains is further capable of electronically disabling further reading and writing of said stored data signals residing in said associated one of said power domains by the associated portion of the specified circuitry residing in said different one of said power domains, said disabling being in response to said one of said low power signals from said different one of said power domains to prevent corruption of said stored data signals residing in said associated one of said power domains.

7. A power loss detection and recovery circuit in a system having a data processing unit which can read and write data on a common data bus, and having a memory designator to direct the data on the common data bus to a first or second data-receiving circuit having a first memory device and a second memory device respectively to simultaneously store the data received at the first or second data-receiving circuit, the power loss detection and recovery circuit comprising:

a first power domain having an electrically isolated voltage bus to provide a first supply voltage to the first data-receiving circuits, including the first memory device, which reside within said first power domain;

a second power domain having an electrically isolated voltage bus to provide a second supply voltage to the second data-receiving circuits, including the second memory device, which reside within said second power domain;

first power loss detection means within said first power domain, for monitoring said first supply voltage and generating a first low power signal upon recognition of a predetermined voltage drop in said first supply voltage;

second power loss detection means within said second power domain, for monitoring said second supply voltage and generating a second low power signal upon recognition of a predetermined voltage drop in said second supply voltage;

first power availability means within said first power domain and coupled to said first power loss detection means for receiving and latching said first low power signal and for providing in response thereto a first power available signal indicating a failure of said first supply voltage;

second power availability means within said second power domain and coupled to said second power loss detection means for receiving and latching said second low power signal and for providing in response thereto a second power available signal indicating a failure of said second supply voltage;

first memory control means within said first power domain coupled to said first power availability means and said second power availability means, for inhibiting writing of the data to the first memory device from the first data-receiving circuits if said first power available signal was received, and for inhibiting writing of the data to the first memory device from the second data-receiving circuits if said second power available signal was received; and second memory control means within said second power domain coupled to said first power availability means and said second power availability means, for inhibiting writing of the data to the second memory device from the first data-receiving circuits if said first power available signal was received, and for inhibiting writing of the data to the second memory device from the second data-receiving circuits if said second power available signal was received.

8. A power loss detection and recovery circuit as in claim 7, further comprising:

first signal latching means within said first power domain, coupled to said second power loss detection means, for receiving and latching said second low power signal, and for providing in response thereto a first power loss signal indicating a failure of said second supply voltage;

second signal latching means within said second power domain, coupled to said first power loss detection means, for receiving and latching said first low power signal, and for providing in response thereto a second power loss signal indicating a failure of said first supply voltage;

first memory selection circuitry within said first power domain, coupled to said first signal latching means, for receiving said first power loss signal, and for inhibiting in response thereto reading of said data from said second memory device; and second memory selection circuitry within said second power domain, coupled to said second signal latching means, for receiving said second power loss signal, and for inhibiting in response thereto reading of said data from said first memory device.

9. A power loss detection and recovery circuit as in claim 8, wherein said first power loss detection means and said second power loss detection means comprise:

a voltage comparator having a positive terminal and a negative terminal;

a voltage regulator coupled to said positive terminal of said voltage comparator to provide a reference voltage to said positive terminal; and a voltage divider coupled to system ground, to said first supply voltage if residing in said first power domain, and to said second supply voltage if residing in said second power domain, and having resistances separated by a node coupled to said negative terminal of said voltage comparator.

10. A power loss detection and recovery circuit as in claim 9, wherein said voltage comparator within said first power loss detection means generates said first low power signal when a resulting voltage at said node decreases below said reference voltage generated by said voltage regulator.

11. A power loss detection and recovery circuit as in claim 9, wherein said voltage comparator within said second power loss detection means generates said second low power signal when a resulting voltage at said node decreases below said reference voltage generated by said voltage regulator.

12. A power loss detection and recovery circuit for use in a dual memory system containing a first memory, first circuits, and a first supply voltage, and a second memory, second circuits and second supply voltage, wherein the second memory simultaneously stores data identical to that stored in the first memory such that the second memory is a duplicate of the first memory, the power loss detection and recovery circuit comprising:

a first voltage layer to couple the first supply voltage to the first circuits and the first memory;

a second voltage layer to couple the second supply voltage to the second circuits and the second memory;

a first voltage comparator having a first input terminal to couple to a first predetermined reference voltage source, and having a second input terminal to couple to the first supply voltage, and further having a first output terminal to provide a first low power signal when the first supply voltage decreases below a first pre-determined reference voltage generated by said first pre-determined reference voltage source;

a second voltage comparator having a third input terminal to couple to a second pre-determined reference voltage source, and having a fourth input terminal to couple to the second supply voltage, and further having a second output terminal to provide a second low power signal when the second supply voltage decreases below a second pre-determined reference voltage generated by said second predetermined reference voltage source;

a first latch powered by the first supply voltage and coupled to said second output terminal of said second voltage comparator, said first latch having a first latch input to receive said second low power signal and a first latch output to provide a first latched low power signal;

a second latch powered by the second supply voltage and coupled to said first output terminal of said first voltage comparator, said second latch having a second latch input to receive said first low power signal and a second latch output to provide a second latched low power signal;

first memory selection means, coupled to said first latch, for disabling access to and from the second memory upon receipt of said first latched low power signal; and second memory selection means, coupled to said second latch, for disabling access to and from the first memory upon receipt of said second latched low power signal.

13. For use in a computer system in protecting against loss of data, wherein the computer system has at least two independent power domains, and where each of the power domains powers independently operable associated circuitry with a separate associated power source, where each associated power source is electrically isolated from the power sources powering the other ones of the power domains, and where each of the power domains has data and control interfaces to the other ones of the power domains, a power loss detection system comprising:

a plurality of power loss detection means, each of said plurality of power loss detection means associated with a different one of the power domains and for detecting whether the voltage from the associated power source has deviated from a predetermined threshold level and for providing power deviation signals in response to said voltage from the associated power source deviating from said predetermined threshold level; and a plurality of power loss recovery means, each of said plurality of power loss recovery means associated with a respective one of the power domains, each of said plurality of power loss recovery means coupled to an associated one of said plurality of power loss detection means from a different one of the plurality of power domains for electronically disabling the data and control interfaces between said respective one of the power domains and said different one of the plurality of power domains in response to said one of said power deviation signals from said different one of said power domains.

* * * * *